US006618268B2

(12) United States Patent
Dibene, II et al.

(10) Patent No.: US 6,618,268 B2
(45) Date of Patent: Sep. 9, 2003

(54) APPARATUS FOR DELIVERING POWER TO HIGH PERFORMANCE ELECTRONIC ASSEMBLIES

(75) Inventors: Joseph T. Dibene, II, Oceanside, CA (US); David H. Hartke, Durango, CO (US); Edward J. Derian, San Diego, CA (US); Carl E. Hoge, San Diego, CA (US); James M. Broder, Ramona, CA (US); Jose B. San Andres, El Cajon, CA (US); Joseph S. Riel, Poway, CA (US)

(73) Assignee: Incep Technologies, Inc., San Diego, CA (US)

( * ) Notice: Subject to any disclaimer, the term of this patent is extended or adjusted under 35 U.S.C. 154(b) by 0 days.

(21) Appl. No.: 09/801,437

(22) Filed: Mar. 8, 2001

(65) Prior Publication Data

US 2001/0036066 A1 Nov. 1, 2001

Related U.S. Application Data

(63) Continuation-in-part of application No. 09/798,541, filed on Mar. 2, 2001, and a continuation-in-part of application No. 09/785,892, filed on Feb. 16, 2001, and a continuation-in-part of application No. 09/727,016, filed on Nov. 28, 2000, and a continuation-in-part of application No. 09/432,878, filed on Nov. 2, 1999, and a continuation-in-part of application No. 09/353,428, filed on Jul. 15, 1999.

(60) Provisional application No. 60/251,184, filed on Dec. 4, 2000, provisional application No. 60/251,223, filed on Dec. 4, 2000, provisional application No. 60/251,222, filed on Dec. 4, 2000, provisional application No. 60/232,971, filed on Sep. 14, 2000, provisional application No. 60/219,813, filed on Jul. 21, 2000, provisional application No. 60/196,059, filed on Apr. 10, 2000, and provisional application No. 60/187,777, filed on Mar. 8, 2000.

(51) Int. Cl.$^7$ .............................................. H01R 12/16
(52) U.S. Cl. ...................... 361/787; 361/790; 361/810; 174/261
(58) Field of Search ................. 361/784, 790, 361/792, 793, 794, 795, 807, 808, 809, 810, 811, 812; 174/260, 262–266

(56) References Cited

U.S. PATENT DOCUMENTS 3,596,138 A * 7/1971 Lehrfeld ...................... 333/238
3,854,374 A * 12/1974 Boyle et al. ............ 174/138 D (List continued on next page.)

FOREIGN PATENT DOCUMENTS

EP 0 582 145 2/1994
EP 0 717 443 A1 6/1996

(List continued on next page.)

OTHER PUBLICATIONS

XP000124263, IBM Tech Disc Bulletin, "Multiple Electronic Board . . . System," 33(3B):55–56.
Patent Abstracts of Japan, 1997, vol. 4 & JP 08 330699, Dec. 13, 1996.
Int'l Search Report of PCT/US00/29452.

Primary Examiner—Kamand Cuneo
Assistant Examiner—José H. Alcalá
(74) Attorney, Agent, or Firm—Knobbe, Martens, Olson & Bear LLP

(57) ABSTRACT

A method, apparatus, and article of manufacture for providing power from a first circuit board having a first circuit board first conductive surface and a first circuit board second conductive surface to a second circuit board having a second circuit board first conductive surface and a second circuit board second conductive surface is described. The apparatus comprises a first conductive member, including a first end having a first conductive member surface electrically coupleable to the first circuit board first conductive surface and a second end distal from the first end having a first conductive member second surface electrically coupleable to the second circuit board first surface. The apparatus also comprises a second conductive member, having a second conductive member first surface electrically coupleable to the first circuit board second surface and a second conductive member second surface distal from the second conductive member first surface electrically coupleable to the second circuit board second conductive surface.

14 Claims, 12 Drawing Sheets

U.S. PATENT DOCUMENTS

| | | | |
|---|---|---|---|
| 4,498,530 A | | 2/1985 | Lipschutz |
| 4,502,193 A | * | 3/1985 | Harmon et al. ......... 174/138 D |
| 4,521,829 A | | 6/1985 | Wessely |
| 4,589,057 A | | 5/1986 | Short |
| 4,760,495 A | | 7/1988 | Till |
| 4,771,365 A | | 9/1988 | Cichocki et al. |
| 4,942,497 A | | 7/1990 | Mine et al. |
| 5,052,481 A | | 10/1991 | Horvath et al. |
| 5,065,280 A | | 11/1991 | Karnezos et al. |
| 5,161,089 A | | 11/1992 | Chu et al. |
| 5,195,020 A | | 3/1993 | Suzuki et al. |
| 5,272,599 A | | 12/1993 | Koenen |
| 5,331,510 A | | 7/1994 | Ouchi et al. |
| 5,343,358 A | | 8/1994 | Hilbrink |
| 5,345,366 A | * | 9/1994 | Cheng et al. ........... 174/138 G |
| 5,365,402 A | | 11/1994 | Hatada et al. |
| 5,380,211 A | | 1/1995 | Kawaguchi et al. |
| 5,390,078 A | | 2/1995 | Taylor |
| 5,396,403 A | | 3/1995 | Patel |
| 5,409,055 A | | 4/1995 | Tanaka et al. |
| 5,460,543 A | * | 10/1995 | Kosmala ..................... 439/567 |
| 5,467,251 A | | 11/1995 | Katchmar |
| 5,473,510 A | | 12/1995 | Dozier, II |
| 5,504,924 A | | 4/1996 | Ohashi et al. |
| 5,510,958 A | | 4/1996 | Shimabara et al. |
| 5,515,912 A | | 5/1996 | Daikoku et al. |
| 5,619,399 A | | 4/1997 | Mok |
| 5,621,615 A | | 4/1997 | Dawson et al. |
| 5,646,826 A | | 7/1997 | Katchmar |
| 5,661,902 A | | 9/1997 | Katchmar |
| 5,708,566 A | | 1/1998 | Hunninghaus et al. |
| 5,729,433 A | | 3/1998 | Mok |
| 5,734,555 A | | 3/1998 | McMahon |
| 5,761,043 A | | 6/1998 | Salmonson |
| 5,794,454 A | | 8/1998 | Harris et al. |
| 5,796,582 A | | 8/1998 | Katchmar |
| 5,801,924 A | | 9/1998 | Salmonson |
| 5,815,921 A | | 10/1998 | Burward-Hoy |
| 5,825,633 A | | 10/1998 | Bujalski et al. |
| 5,842,514 A | | 12/1998 | Zapach et al. |
| 5,856,911 A | | 1/1999 | Riley |
| 5,864,478 A | | 1/1999 | McCutchan et al. |
| 5,898,573 A | | 4/1999 | Fugaro |
| 5,920,458 A | | 7/1999 | Azar |
| 5,930,115 A | | 7/1999 | Tracy et al. |
| 5,980,267 A | | 11/1999 | Ayers et al. |
| 5,986,887 A | | 11/1999 | Smith et al. |
| 5,995,370 A | | 11/1999 | Nakamori |
| 6,231,352 B1 | | 5/2001 | Gonzales |
| 6,338,634 B1 | * | 1/2002 | Yu .............................. 439/83 |
| 6,347,042 B1 | * | 2/2002 | White .................... 174/138 D |

FOREIGN PATENT DOCUMENTS

| | | |
|---|---|---|
| EP | 0 920 055 A2 | 6/1999 |
| JP | 08204304 | 8/1996 |
| JP | 11-074427 | 3/1999 |
| WO | WO 96/23397 | 8/1996 |

* cited by examiner

Section A-A

Section A-A

Section A-A

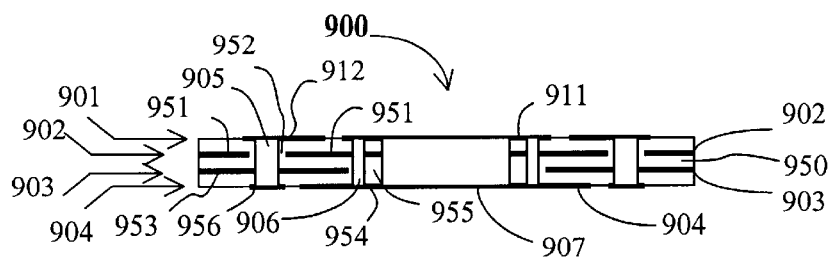
FIG. 9A
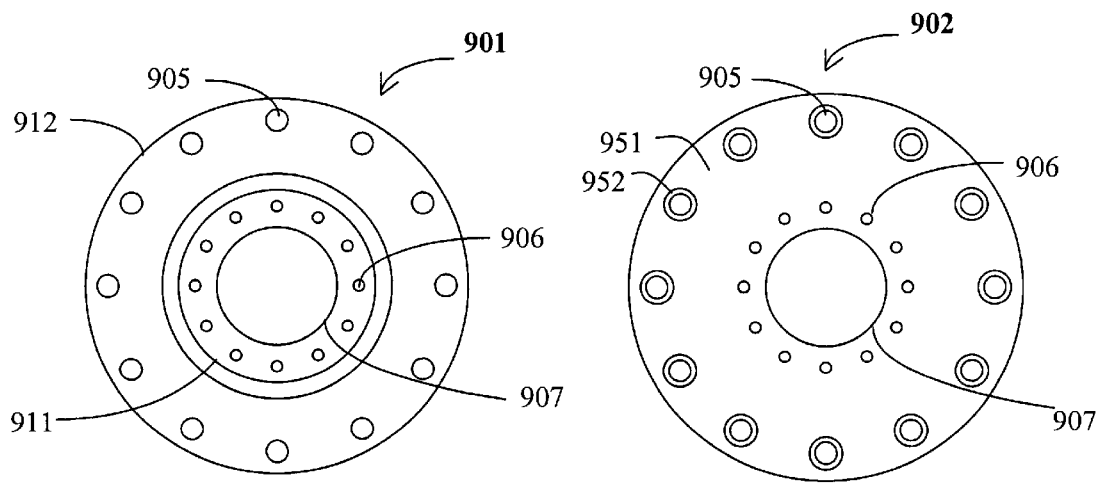
FIG. 9B        FIG. 9C
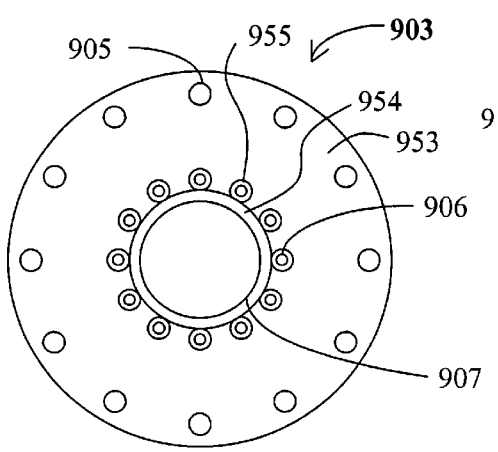 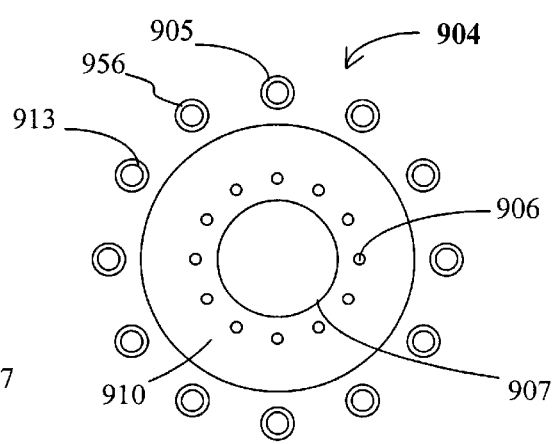
FIG. 9D        FIG. 9E Section A-A

APPARATUS FOR DELIVERING POWER TO HIGH PERFORMANCE ELECTRONIC ASSEMBLIES

CROSS-REFERENCE TO RELATED APPLICATIONS

This application claims benefit of the following U.S. Provisional Patent Applications, each of which are incorporated by reference herein:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

Application Ser. No. 60/219,813, entitled "HIGH CURRENT MICROPROCESSOR POWER DELIVERY SYSTEMS," by Joseph T. DiBene II, filed Jul. 21, 2000;

Application Ser. No. 60/222,386, entitled 'HIGH DENSITY CIRCULAR 'PIN'0 CONNECTOR FOR HIGH SPEED SIGNAL INTERCONNECT," by David H. Hartke, and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke, and Joseph T. DiBene II, filed Aug. 2, 2000;

Application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO-I-PAK FOR POWER DELIVERY TO MICROELECTRONICS," by Joseph T. DiBene II and Carl B. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAl INTERCONNECTION TECHNOLOGIES USING FLEX CABLE INTERCONNECT FOR POWER DELIVERY IN 'INCEP' INTEGRATED ARCHITECTURE" by David Hartke, James M. Broder, and Joseph T. DiBene II, filed Feb. 6, 2001.

This patent application is also continuation-in-part of the following co-pending and commonly assigned patent applications, each of which applications are hereby incorporated by reference herein:

Application Ser. No. 09/353,428, entitled "INTER-CIRCUIT ENCAPSULATED PACKAGING," by Joseph T. DiBene II and David H. Hartke, filed Jul. 15, 1999 now U.S. Pat. No. 6,304,450;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999 now U.S. Pat. No. 6,356,448;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000 now abandoned;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001; and Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001.

This patent application is also related to application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH THERMALLY CONDUCTING PLATE," by Joseph T. DiBene II and David H. Hartke, filed on Mar. 8, 2001, which application is hereby incorporated by reference herein.

BACKGROUND OF THE INVENTION

1. Field of the Invention

This invention relates in general to a system for providing electrical continuity between a plurality of circuit boards, and in particular to a method and apparatus for improving the packaging and distribution of power to high performance electronic circuit assemblies.

2. Description of the Related Art

As electronic circuitry becomes more complex, packaging of the circuitry has become more difficult. The common method for packaging integrated circuits (ICs) and other electronic components is to mount them on printed circuit boards (PCBs) or other substrates such as ceramics having alternating conductive and non-conductive layers or planes sandwiched or bonded together to form a dense X-Y signal interconnect. For a number of years, the operating voltage of ICs was approximately 5 volts and the power consumption was generally less than 1 watt. This relatively high supply voltage and low power level allowed the packaging of a large number of ICs on a single PCB with power distribution incorporated into one or more of the PCB planes.

More recently advances in silicon fabrication techniques have permitted the manufacture of high performance IC packages with operating voltages at or below 1 volt and power levels in excess of 100 watts. As described in co-pending and commonly assigned patent application Ser. No. 09/785,892, METHOD AND APPARATUS FOR PROVIDING POWER TO A MICROPROCESSOR WITH INTEGRATED THERMAL AND EMI MANAGEMENT, by Joseph T. DiBene II, David H. Hartke, James J. Hjerpe Kaskade, and Carl E. Hoge, filed Feb. 16, 2001, which application is hereby incorporated by reference, the transient current to some of these packages can exceed hundreds of amps per microsecond. To assure optimum performance under these conditions, it is important that the electrical path from the power supply to the IC be designed to accommodate high current flow and low series inductance, two goals which are difficult to achieve at the same time. The present invention achieves both of these goals, while also allowing for a compact, integrated stack-up system design that permits thermal dissipation and control of electromagnetic interference (EMI).

SUMMARY OF THE INVENTION

To address the requirements described above, the present invention discloses a method, apparatus, article of manufacture, for providing power from a first circuit board having a first circuit board first conductive surface and a first circuit board second conductive surface to a second circuit board having a second circuit board first conductive surface and a second circuit board second conductive surface. The apparatus comprises a first conductive member, including a first end having a first conductive member surface electrically coupleable to the first circuit board first conductive surface and a second end distal from the first end having a first conductive member second surface electrically coupleable to the second circuit board first surface. The apparatus also comprises a second conductive member, having a second conductive member first surface electrically coupleable to the first circuit board second surface and a second conductive member second surface distal from the second conductive member first surface electrically coupleable to the second circuit board second conductive surface. In one embodiment of the invention, the second conductive member is hollow, and is disposed within the second conductive member in a coaxial arrangement. If desired, a dielectric can be placed between the first conductive member and the second conductive member. The dielectric, or the dimensions of the first conductive member and the second conductive member can be defined so that the apparatus exhibits an impedance that can be used cooperatively with circuit elements on either the first circuit board or the second circuit board. One of the advantages of the present invention is the integration of function in which the apparatus operates both as a rigid standoff to separate the first circuit board from the second circuit board, and a conduit for delivering power and a ground return (or other signals) between the circuit boards as well. While the apparatus will be discussed in terms of providing a power signal from a first circuit board to a second circuit board, it can also be used to provide power to a plurality of circuit boards in a stacked up configuration, all with minimal impedance.

BRIEF DESCRIPTION OF THE DRAWINGS

Referring now to the drawings in which like reference numbers represent corresponding parts throughout:

FIG. 9A is a two-dimensional section view of a planar circuit structure illustrating how the layers in a multi-layered circuit structure can be arranged to efficiently couple dynamic electrical current impulses from the inner planes of the planar structure to the inner and outer cylinders of a coaxial power standoff assembly utilizing a screw connection as illustrated in FIG. 3;

FIG. 9B is a two-dimensional plan view of the top most layer of FIG. 9A;

FIG. 9C is a two-dimensional plan view of the upper inner layer of FIG. 9A;

FIG. 9D is a two-dimensional plan view of the lower inner layer of FIG. 9A; and

FIG. 9E is a two-dimensional plan view of the lower most layer of FIG. 9A;

DETAILED DESCRIPTION OF PREFERRED EMBODIMENTS

Figure 1A:
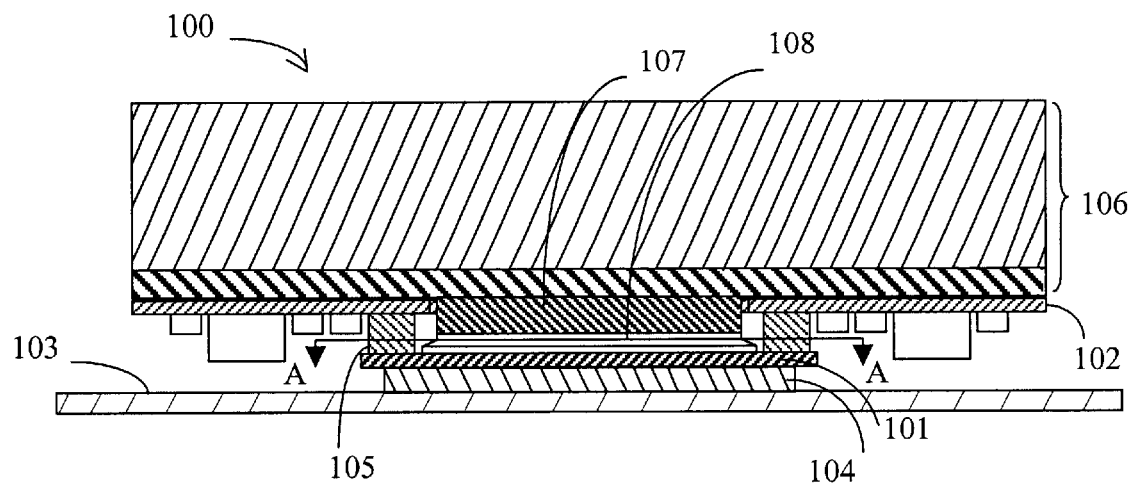
FIG. 1A is a two-dimensional section view illustrating an architecture in which the present invention may be usefully employed in delivering power to a microprocessor.

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

The present invention discloses an apparatus for providing power from a first circuit board to a second circuit board. In one embodiment, the apparatus (hereinafter alternatively referred to as a POWERDIRECT or a standoff) comprises an inner cylindrical cylinder, an intermediate coaxially located insulator or dielectric material and an outer coaxially located cylindrical cylinder. The standoff is disposed between a first planar structure or printed circuit board and a second planar structure or printed circuit board to provide a path for the transfer of electrical power and a ground return between the two planar structures in an efficient manner. This creates a very low impedance interconnect between power and groundplanes on the first planar structure and power and ground planes on the second planar structure.

The present invention discloses a variety of methods in which the coaxial cylinders of the power standoff assembly may be joined to the upper and lower planar structures and their internal power planes. It also discloses efficient methods of connecting the internal power planes of the planar structures to external land features of the planar structures in such a manner as to further enhance the efficacy of the interconnect between power planes on the first planar structure and power planes on the second planar structure.

The present invention further describes a specific application where the power standoff assembly may be especially beneficial to delivering power to high performance microprocessor packages in such a manner as to negate the need to integrate power regulation circuitry directly onto the microprocessor package (On-Package-Voltage-Regulation, OPVR) so as to improve the producibility, yield and cost of modern high performance microprocessors.

Encapsulated Circuit Assembly

Typically, a modern high performance microprocessor die is flip-chip attached to an organic or ceramic substrate utilizing a Controlled-Collapse-Chip-Connection (C4). The substrate has one or more power planes which are used to distribute power to the chip connections. Often the power requirements of the microprocessor exceed 100 watts at operating voltages of approximately 1 volt and transient current requirements in excess of 100 amps per microsecond. Typically power conditioning may be provided by a voltage regulation module (VRM). The stringent power demands require that the VRM be very closely coupled to the microprocessor or directly mounted on to the microprocessor substrate. OPVR architectures combine VRM technology with high performance silicon technology all on a common substrate. The OVPR often very expensive because of the very large number of layers required to manage both the power and signal interconnect to the microprocessor die. The resulting assembly also has reduced yield and higher costs than what might be achieved if the microprocessor function could be separated from the VRM function.

FIG. 1A is a diagram illustrating a stack up assembly 100 illustrating the use of a power standoff assembly 105 to deliver power to a microprocessor substrate 101 and its associated lid 108 from a remotely located VRM assembly 102. In the illustrated embodiment, the VRM assembly 102 surrounds the microprocessor lid 108, thus saving space in the z (vertical) axis.

The microprocessor lid 108 is thermally coupled to a heatsink structure 106 through a thermal coupling mesa 107 and appropriate thermal interface material (TIM) such as thermal grease (not shown) which can be integral to the base of 107 or a separate structure that is coupled (i.e. bonded, or metallically fused) to the base of the heatsink structure 106. Furthermore, heat generated from components in the VRM assembly 102 can be thermally attached directly to the base of heatsink assembly 106, thus sharing the heat dissipation benefits of the heatsink assembly 106. Signals from the microprocessor can be connected through pins (not shown) to socket 104 which is mounted to main board 103.

Power from the VRM assembly 102 is efficiently coupled to the microprocessor substrate 101 by utilizing one or more power standoff assemblies 105. In one embodiment, four power standoff assemblies 105 are used, and each is located proximate a corner of the microprocessor substrate 101.

Figure 1B:
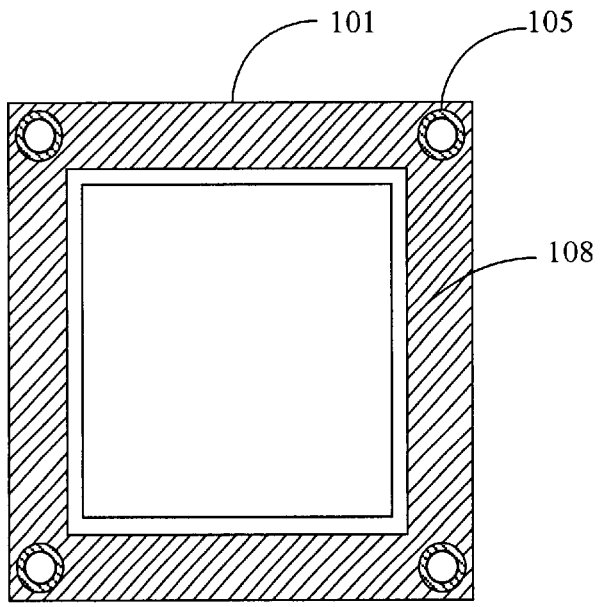
FIG. 1B is a section view of a microprocessor package used in FIG. 1A which further illustrates the location of the power standoff assemblies associated with delivering power to the microprocessor shown if FIG. 1A.

FIG. 1B is a diagram showing the location of the four power standoff assemblies 105 proximate the corners of the microprocessor substrate 105. The power standoff assemblies 105 may be located in other locations on the substrate 101 such as at the center of each side. Further, the number of power standoff assemblies 105 used can be varied to meet the power needs of target microprocessor or other high performance Integrated Circuit assembly.

Coaxial Interconnect

Figure 2A:
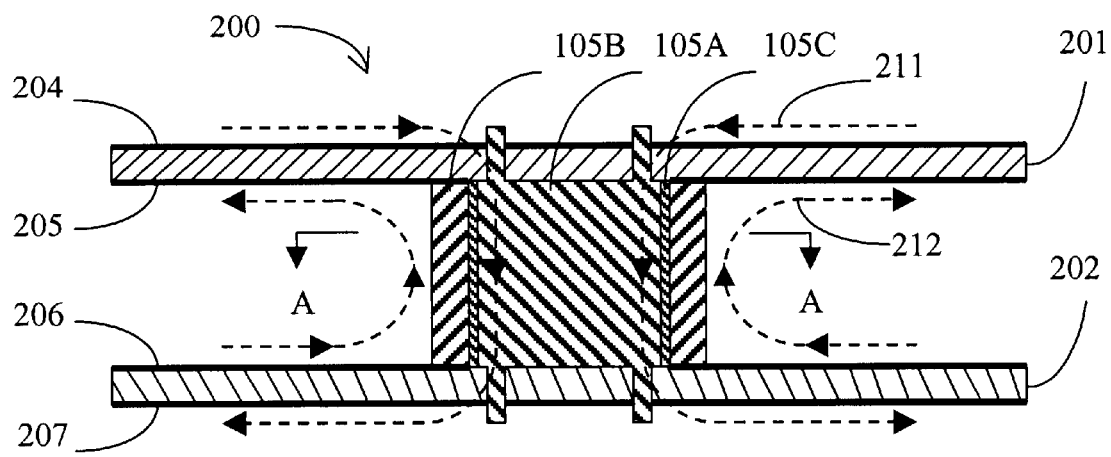
FIG. 2A is a two-dimensional section view of a conceptual coaxial interconnect illustrating the delivery of electrical energy from an upper planar circuit structure to a lower planar circuit structure.
Figure 2B:
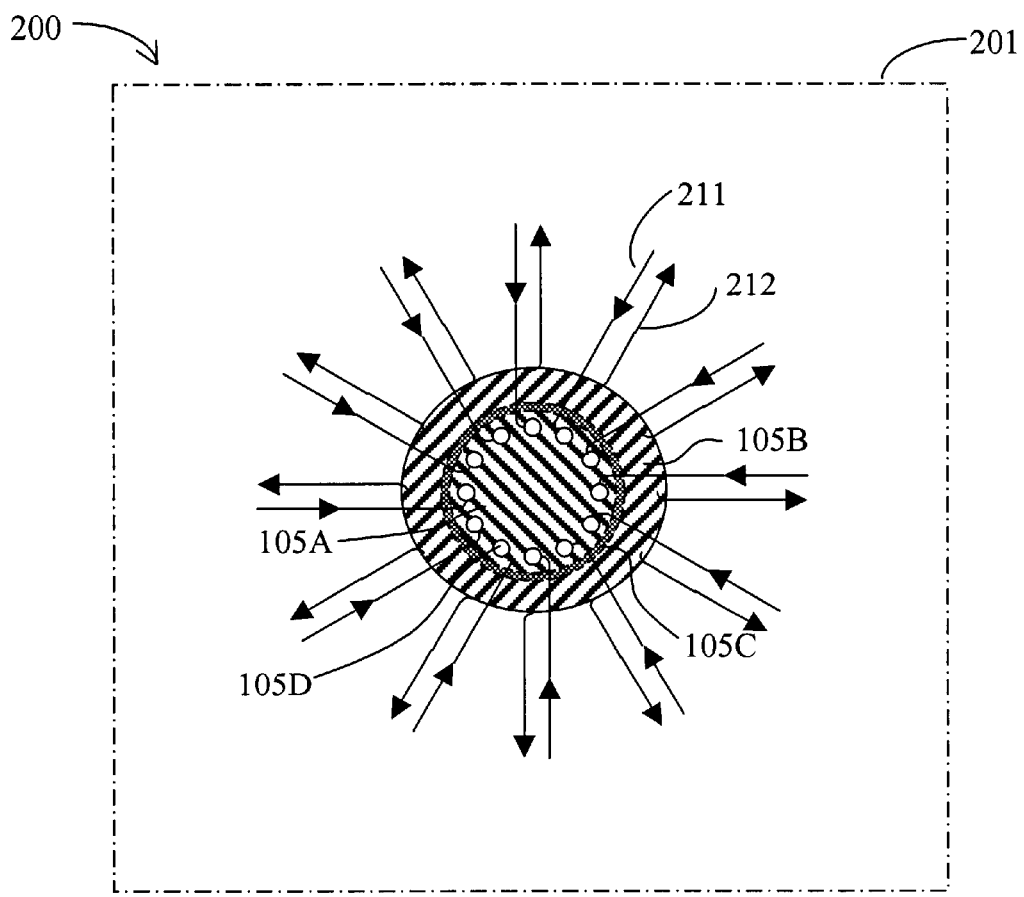
FIG. 2B is two-dimensional plan view of the current flow to the coaxial interconnect structure in the upper planar circuit of FIG. 2A.

FIGS. 2A and 2B are diagrams illustrating transfer of energy from a source (such as a VRM assembly 102) on a first circuit board 201 to a second circuit board 202 through one or more power standoff assemblies 105.

A power signal 211 supplying current flows from the VRM on the first circuit board 201 (hereinafter alternatively referred to as first PCB) through a conductive plane 204 in or on the first circuit board 201 to one or more power standoff assembly connections 105D. The power signal 211 then passes through the first conductive member 105A to similar connections on the second circuit board 202 and then onto a conductive plane 207 in or on the second circuit board 202, and thence to the load (e.g. the IC, microprocessor or other power dissipating device). A ground return signal 212 passes from a ground plane 206 in or on the second circuit board 202 through a conductive surface 213 to a second conductive member 105B, through the second conductive member 105B, to a conductive plane 205 on or in the first circuit board 201. This acts as a ground return for the VRM power signal 211. The space between the first conductive member 105A and the second conductive member 105B may include a dielectric or electric insulator 105C, if desired.

In a preferred embodiment, the second conductive member 105B is hollow and the first conductive member 105A is disposed within the second conductive member 105B such that they are substantially coaxial (e.g. the major axis of the first conductive member and the major axis of the second conductive member are co-linear). In this embodiment, the series inductance of the power standoff assembly 105 is governed primarily by the basic equation;

$$L_{COAX} = \frac{\mu_0 h}{2\pi} \ln(D_O/D_I)$$

where $\mu_0$ is the permeability of space, h is the length of the power standoff 105 body, $D_O$ is the inner diameter of the outer conductor, and $D_I$ is the diameter of the inner conductor. As the diameters get closer to each other the natural log function approaches zero. This is the theoretical limit the inductance may achieve with such a construction. Practical issues limit achieving this limit however with such a construction the actual inductance achieved may be very low.

As described further with respect to FIGS. 9A–9E, the power plane 204, 206 and the ground plane 205, 207 of the first circuit board 201 and the second circuit board 202 may be on inner layers, instead of on an external surface of the circuit boards 201, 202. In this case, through holes can be used on the first circuit board 201 and second circuit board 202. These thru-hole patterns can also be coaxially arranged proximate to where first and second conductive members 105A, 105B are connected to the first and the second circuit boards 201, 202. Also, plane inductance (inductance from the plane pairs 204/205 and 206/207) can be reduced by the bringing the plane pairs 204/205 and 206/207 closer together.

One of the reasons for reducing the interconnection inductance is that the voltage drop across the interconnect is crucial for proper operation. As stated previously, high current slew-rates can create large drops across an inductive interconnect. This may be seen by the simple equation for the dynamic voltage drop across an interconnect:

$$\Delta V \cong I_{STEP} R_{AC} + L_{TOT} \frac{dI}{dt}$$

Where $I_{step}$ is the step current the IC creates when switching transistors internally, $R_{AC}$ is the AC resistance of the interconnect, $L_{TOT}$ is the total inductance of the interconnect, and dI/dt is the rate of change or AC current slew-rate which occurs due to the switching transistors. Often the inductance is the dominant element in the path and thus contributes to the largest portion of the drop across the interconnect.

Coaxial and Multi-Axial Embodiments

Figure 3:
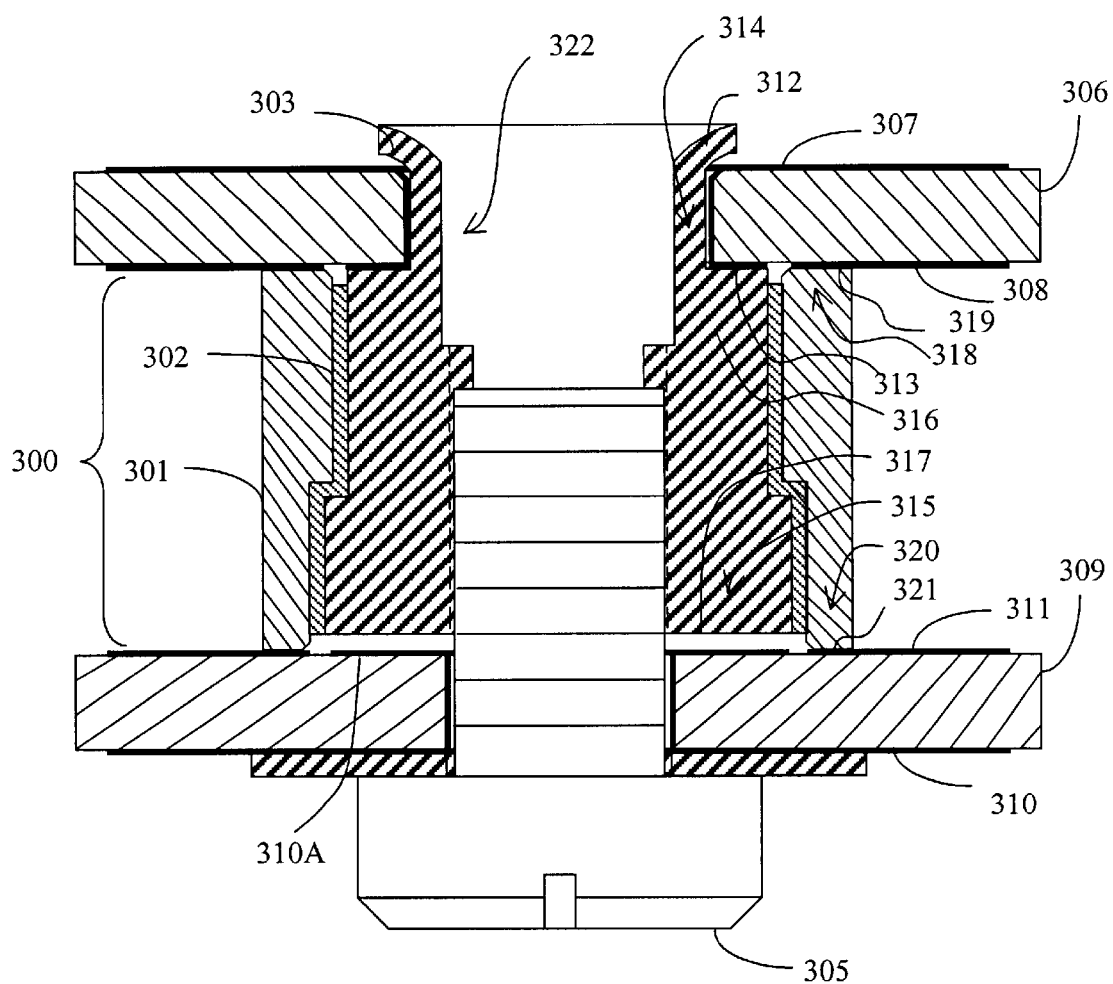
FIG. 3 is a two-dimensional section view of a power standoff assembly structure in which the inner cylinder is swaged to the upper planar circuit and a screw forms both a mechanical and electrical connection to a lower planar circuit.

FIG. 3 is a diagram illustrating a preferred embodiment of a power feed standoff assembly 300. The power feed standoff assembly 300 is used to route power and/or signals from a first circuit board 306 to a second circuit board 309.

The power feed standoff assembly 300 comprises a first conductive member 303 and a second conductive member 301. In the illustrated embodiment, the second conductive member 301 is hollow, and the first conductive member 303 is disposed within the second conductive member 301. Also, the first conductive member 303 and second conductive member 301 are coaxial (e.g. the longitudinal axes of symmetry of each are substantially colinear). Hence, the first conductive member 303 is disposed within and coaxially with the second conductive member 301.

The first conductive member 303 includes a first end 314. The first end 314 includes a shoulder portion 316 having a first conductive member first surface 313 that is electrically coupleable to a first conductive surface 307 on the first circuit board 306, such as a pad. The first conductive member 303 also includes a second end 315 distal from the first end 314 having a first conductive member second surface 317 electrically coupleable with a first conductive surface 310 or pad of the second circuit board 309. In the illustrated embodiment, the first conductive member second surface 317 does not directly contact the first surface 310A of the second circuit board 309. Instead, electrical coupling between the first conductive member second surface 317 and the first surface 310 of the second circuit board 309 is accomplished by a screw 305 that is electrically coupled to both the first conductive member 303 and the first surface 310 of the second circuit board. As can be seen from FIG. 3, direct contact between the second end 315 of the first conductive member and the first surface 310 of the second circuit board 309, (e.g. between first conductive member second surface 317 and surface 31 OA) is possible as well.

The second conductive member 301 includes a first end 318 having a second conductive member first surface 319. The second conductive member first surface 319 is electrically coupled to a first circuit board 306 second conductive surface 308. In the illustrated embodiment, the second conductive member first surface 319 is directly coupled to the first circuit board 306 second conductive surface 308, but this need not be the case.

The second conductive member 301 includes a second end 320 having a second conductive member second surface 321. The second conductive member second surface 321 is electrically coupled to the second circuit board second surface 311. In the illustrated embodiment, the second conductive member second surface 321 is directly coupled to the second circuit board second surface 311, but this need not be the case.

In the illustrated embodiment, both the first conductive member 303 and the second conductive member 301 are cylindrical in shape (e.g. generally circular in cross section), but this need not be the case. Although the circular cross section depicted is preferred, the first and second conductive members 303, 301 may be of an ovoid, rectangular, or trapezoidal cross section. Or, the conductive members 303, 301 may simply be a pair of adjacent linear conductive members having an insulator or insulating space therebetween. In each case, the longitudinal axes of symmetry for the first and second conductive members 303, 301 can be made substantially co-linear.

The first conductive member 303 is also disposed through a plated through hole (PTH) in the first circuit board 306. The first conductive member 303 can be affixed to the first circuit board 306 by a swage 312. The swage 312 works cooperatively with the shoulder portion 316 to affix the first conductive member 303 to the first circuit board 306.

The first conductive member 303 can be further attached to the first circuit board 306 by a soldering. However, soldering alone is not the preferred method of affixing the first conductive member 303 to the first circuit board 306.

The plated through hole 322 and the surrounding first circuit board first surface 307 together with the first conductive member 303 define an inner coaxial power circuit. In one embodiment, the inner coaxial power circuit is completed by a conductive fastening device 305 such as a screw, which makes electrical contact with the first conductive member 303 and the second circuit board first surface 310, thus forming an electrically conductive path from the first circuit board 306 to the second circuit board 309. In one embodiment, the first conductive member 303 includes hollow portion having a threaded inner surface configured to accept and hold. Also, the height of the first conductive member 303 is typically slightly less than the height of the second conductive member 301 for the reasons described below.

The second conductive member 301 forms the outer coaxial circuit engaging the first circuit board second surface 308 (which may include a power pad pattern) and the second circuit board second surface 311. In one embodiment, dielectric 302 does not grip the first conductive member 303 and the second conductive member 301 so tightly that their relative position can not be adjusted slightly with a force imparted by fastener 305 such that the upper surface 313 of first conductor 303 can come into intimate contact with the first circuit board second surface 308, thus completing the upper half of the outer coaxial power circuit.

Because the first conductor 303 is slightly shorter than second conductor 301 both circuit feeds have identical and predictable joining forces between PCB 306 and PCB 309. Such would not be the case if the two conductors 303, 301 were of approximately equal length where slight variations in length may cause an unpredictable shift in forces between the two conductors as they press against the surfaces of PCB 306 and 309. Further, the fact that the first conductive member 303 and the second conductive member 301 are coaxially arranged to reduce the unwanted electromagnetic fields that might be created from electric disturbances induced into the assembly 300.

Production

The power feed standoff assembly 300 may be produced by separately fabricating items 301, 302 and 303 and pressing them together forming an inseparable assembly. The power feed standoff assembly 300 may also be produced by separately fashioning the first conductive member 303 and the second conductive member 301, supporting the members 301, 303 in a fixture, and inserting a dielectric 302 into the gap separating 301 and 303 (e.g. under heat and pressure) and curing the dielectric material 302. It should be noted that second conductor 301, dielectric 302 and first conductor 303 can be separate parts that are assembled in a different sequence than is described above without detracting from the benefits of this invention.

Further Embodiments

Figure 4:
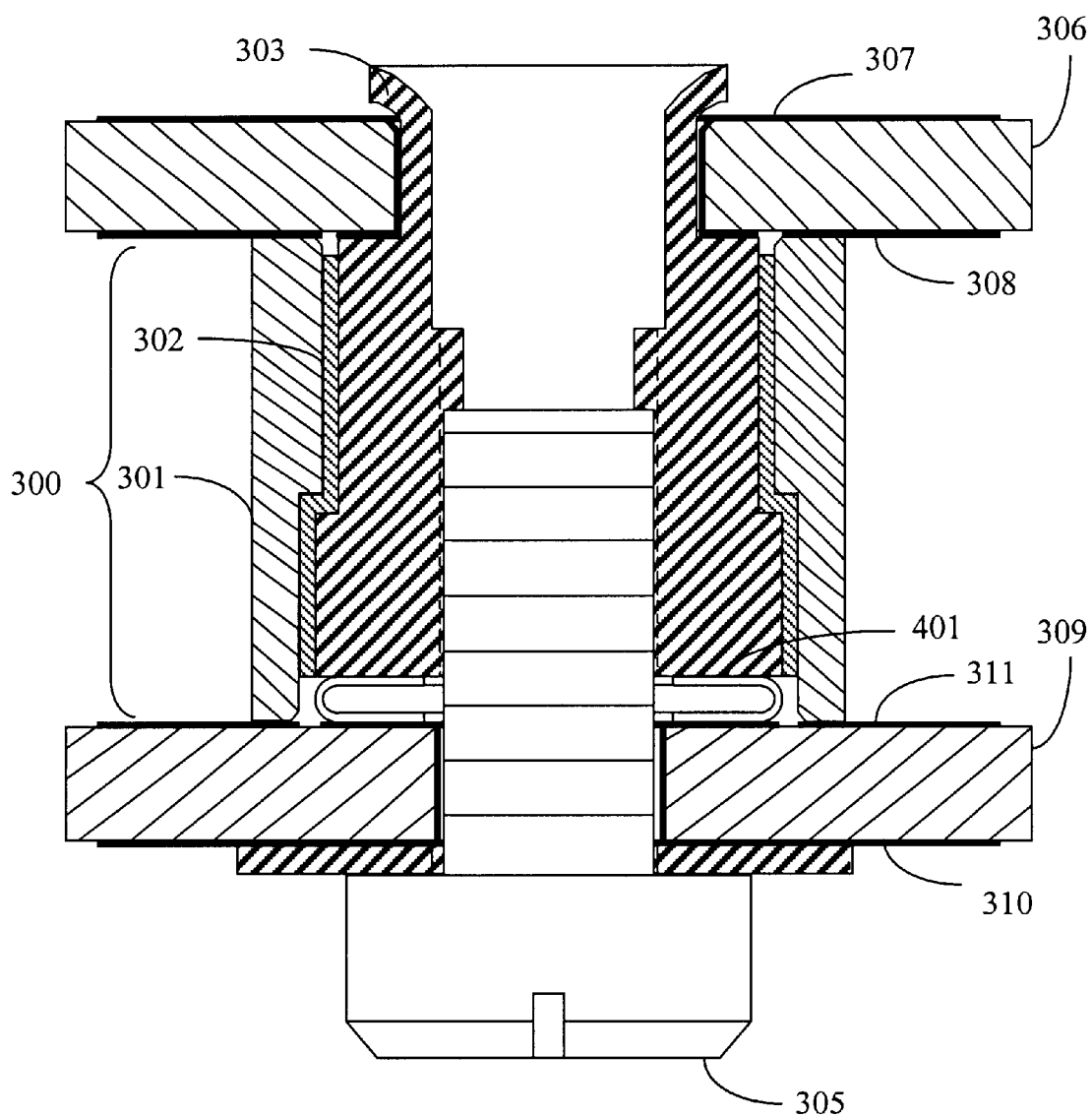
FIG. 4 is a two-dimensional section view of a power standoff assembly structure in which the inner cylinder is swaged to the upper planar circuit and a crushable spring washer forms an electrical connection from the inner cylinder to a lower planar circuit while a screw forms the mechanical connection.

FIG. 4 is a two-dimensional sectional view of another embodiment of the power feed standoff assembly 300. This embodiment is similar to that which is depicted in FIG. 3, however, a compressible conductive member such as a crushable washer 401 is disposed between the second circuit board 309 first surface 310 and the first conductive member second surface 317. This provides a direct path by which current in the first conductive member 303 passes directly to the first conductive surface 310 on the second circuit board 309. Crushable washer 401 significantly reduces the inductance of the electrical interconnect because current does not have to proceed through the screw body to the second circuit board 309 first conductive surface 310 but rather can proceed directly from the base of first conductive member 303 to the second circuit board 309 first conductive surface 310. The crushable washer 401 still provides the benefits of providing predictable forces to both the first and second conductive members 303 and 301 respectively. It is also noted that the compressible range of crushable washer 401 need not be excessive, since acceptable tolerances are limited principally to the height variations between first conductive member 303 and second conductive member 301 which is typically less than 2 mils.

Figure 5:
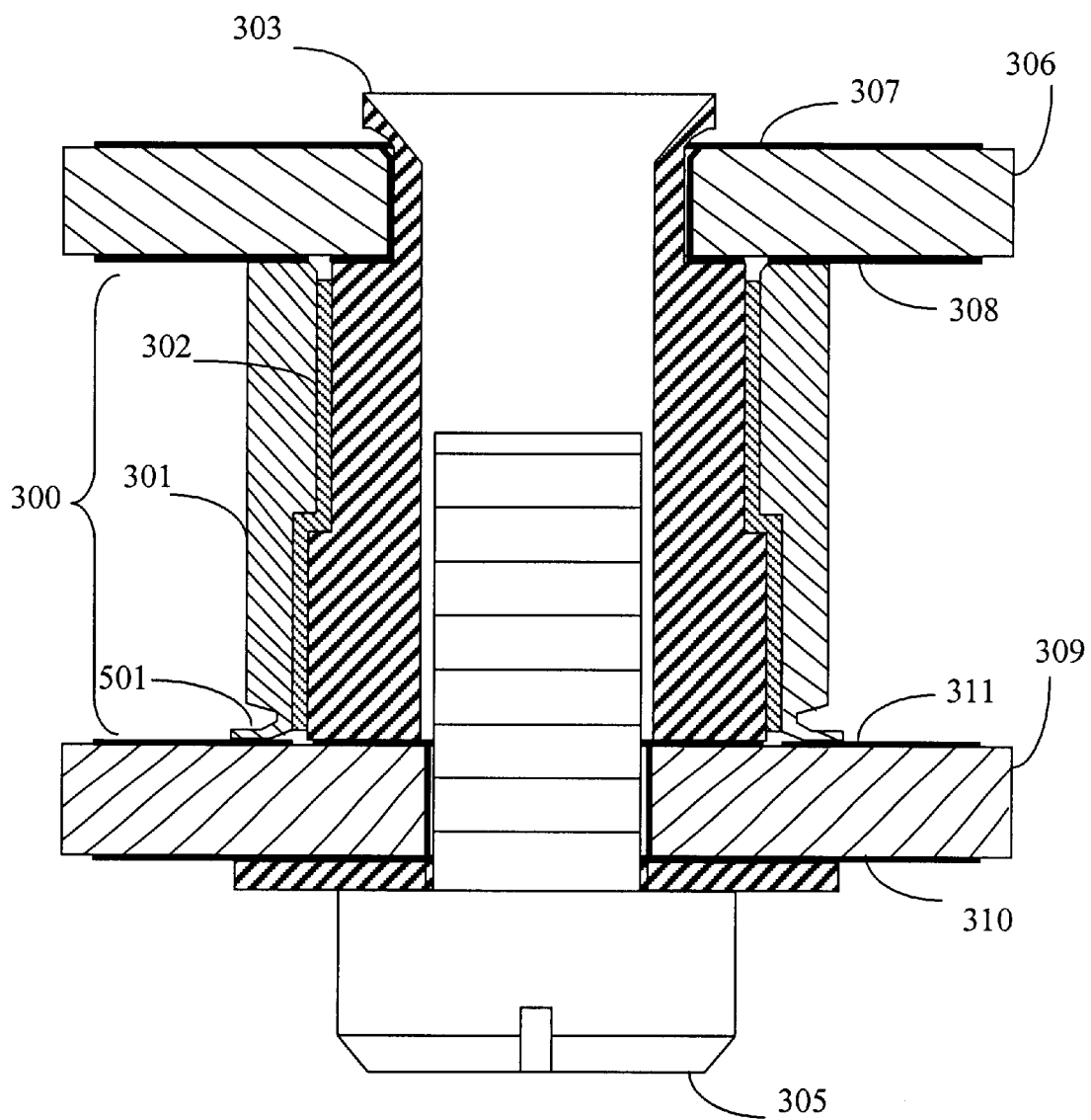
FIG. 5 is a two-dimensional section view of a power standoff assembly structure in which the inner cylinder is swaged to the upper planar circuit and a screw forms the mechanical connection of the inner cylinder to the lower circuit structure while a spring feature is incorporated into the outer cylinder in order to accommodate electrical connection of the outer cylinder to the lower planar circuit.

FIG. 5 is a two-dimensional section view of another embodiment of the power feed standoff assembly 300, illustrating still another structure for eliminating the passage of current through the screw 305. Unlike the embodiment FIG. 4 where the compliant member was the crushable washer 401 located so as to be in electrical contact with the first conductive member 303, in this embodiment, the second conductive member 303 is fabricated with a compressibly compliant section 501 which acts as a spring. In this arrangement, first conductive member conductor 303 is the "fixed" height member and second conductive member 301 is the slightly longer member with a compressibly compliant end section 501 that takes up variations in height between first conductive member 303 and the second conductive member 301, providing a direct path for both the first and second conductor members 303 and 301 to the second circuit board first conductive surface 310 and the second circuit board second conductive surface 311, respectively.

Figure 6:
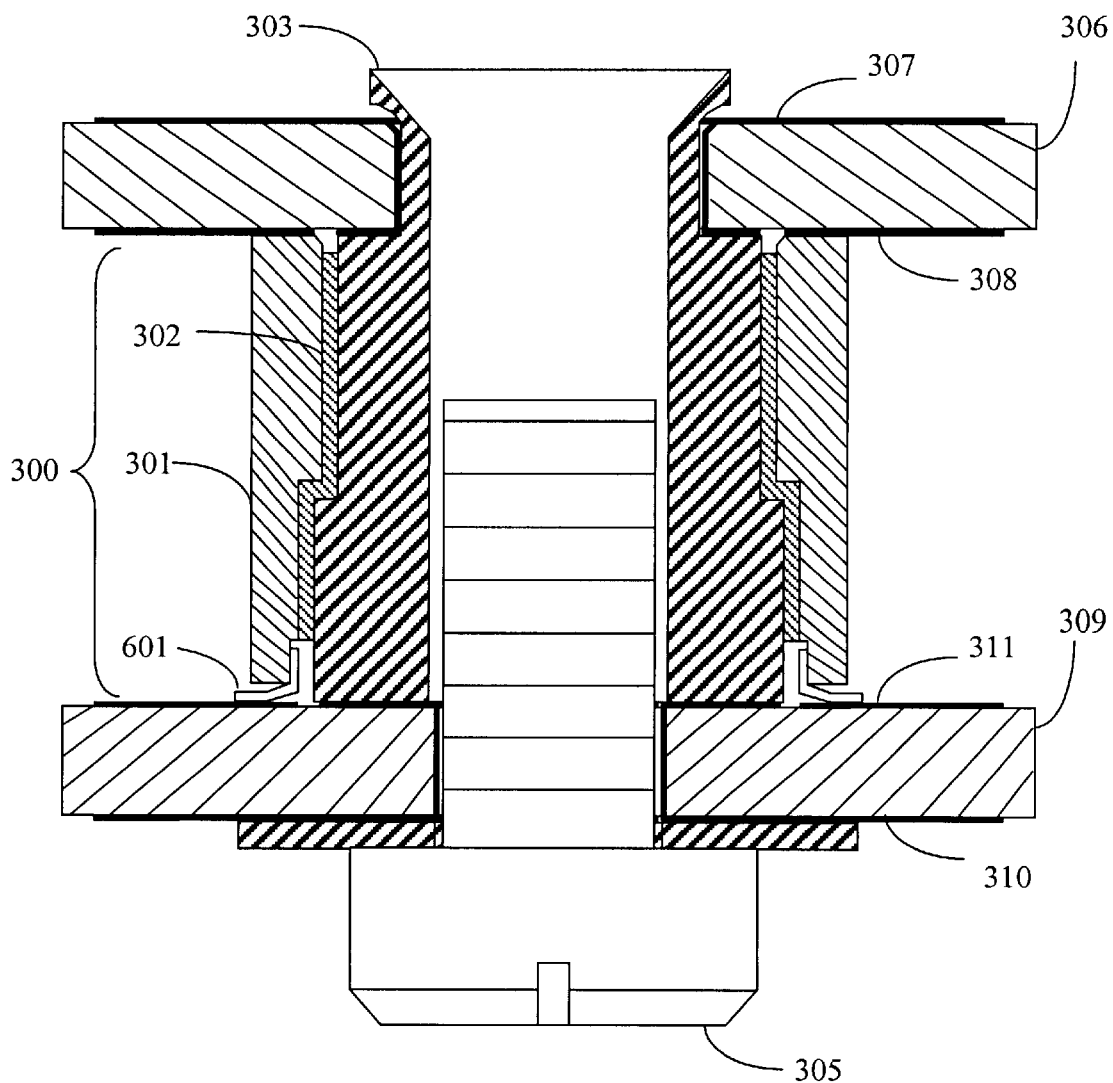
FIG. 6 is a two-dimensional section view of a power standoff assembly structure in which the inner cylinder is swaged to the upper planar circuit and a screw forms the mechanical connection of the inner cylinder to the lower circuit structure while a spring insert is incorporated into the outer cylinder in order to accommodate electrical connection of the outer cylinder to the lower planar circuit.

FIG. 6 is a diagram of another embodiment of the power feed standoff assembly 300. In this embodiment, the integral compressibly compliant end section formed by the body of the second conductive member 301 is replaced with a separate compressibly compliant member 601 which is inserted into an inner surface of the second conductive member 301.

Figure 7A:
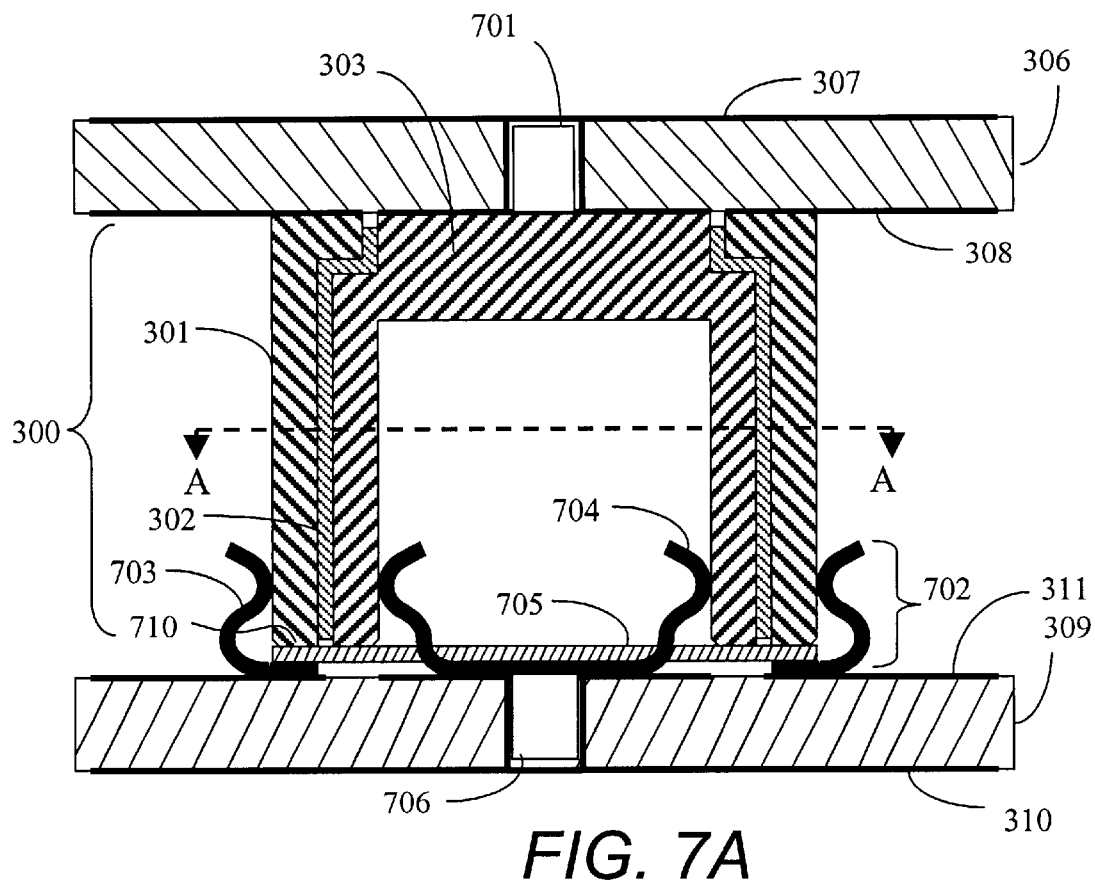
FIG. 7A is a two-dimensional section view of a power standoff assembly structure in which the inner and outer cylinders are soldered to the upper planar circuit while the connection of these cylinders to the lower planar circuit is accommodated by the use of a coaxial spring contact assembly.

FIG. 7A is a diagram illustrating another embodiment of the power feed standoff assembly 300. In this embodiment, a spring contact assembly 702 is used to electrically connect lower half (i.e. the second ends) of the first conductive member 303 and the second conductive member 301 to the second circuit board 309. In the illustrated embodiment, the spring contact assembly 702 includes a plurality of cantilever beam spring elements 703 and 704.

In this embodiment, the upper portion (i.e. the first end) of the power feed standoff assembly 300 may be solder attached to the first circuit board 306 and the respective first circuit boad conductive surfaces 307 and 308. This is because this embodiment does not result in a continuous vertical force on the power feed standoff assembly 300 causing solder creepage. A center locating feature 701 in or on the first circuit board 306 may be employed to locate the power feed standoff assembly 300 to the first circuit board 306 prior to soldering.

Figure 7B:
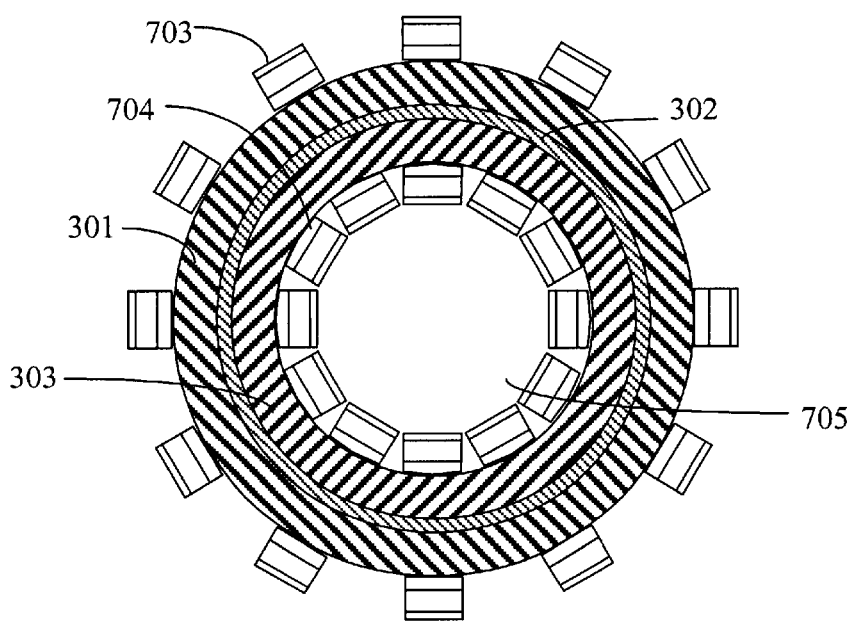
FIG. 7B is a two-dimensional plan section view of the power standoff assembly structure of FIG. 7A further illustrating the coaxial spring contact assembly.

The spring contact assembly 702 comprises a first contact 703 that is electrically coupled to the second circuit board second conductive surface 311. The first contact 703 slidably and releaseably contacts the outer surface of the second conductive member 301. The spring contact assembly 702 further comprises a second contact 704 that is electrically coupled to the second circuit board first conductive surface 310, and slidably and releasably contacts an inner surface of the first conductive member 303. An insulating member 705 is disposed between a portion of the first contact 703 adjacent to second conductive member second surface 710. The insulating member 705, which can be made from plastic, is used to hold together spring contacts 703 and 704 prior to permanent installation onto second circuit board conductive surfaces 310 and 311, and to insulate the spring contact 703 from the second conductive surface 311. The spring contact assembly 702 is used to electrically contact the first and second conductive members 303, 301 of the power feed standoff assembly 300 in a low inductance manner to conductive surfaces 310 and 311 on the second circuit board 309. A center locating feature 706 in or on the second circuit board 309 may be useful in locating the spring contact assembly 702 to the second circuit board 309 prior to soldering. The contacts 703, 704 of the spring assembly can be ring-shaped when viewed from above, or may comprises a plurality of piecewise linear springs disposed radially to contact the first and second conductive members 303, 301. This embodiment is further illustrated in FIG. 7B, which presents a plan section view looking downward into the spring assembly 702.

Figure 8A:
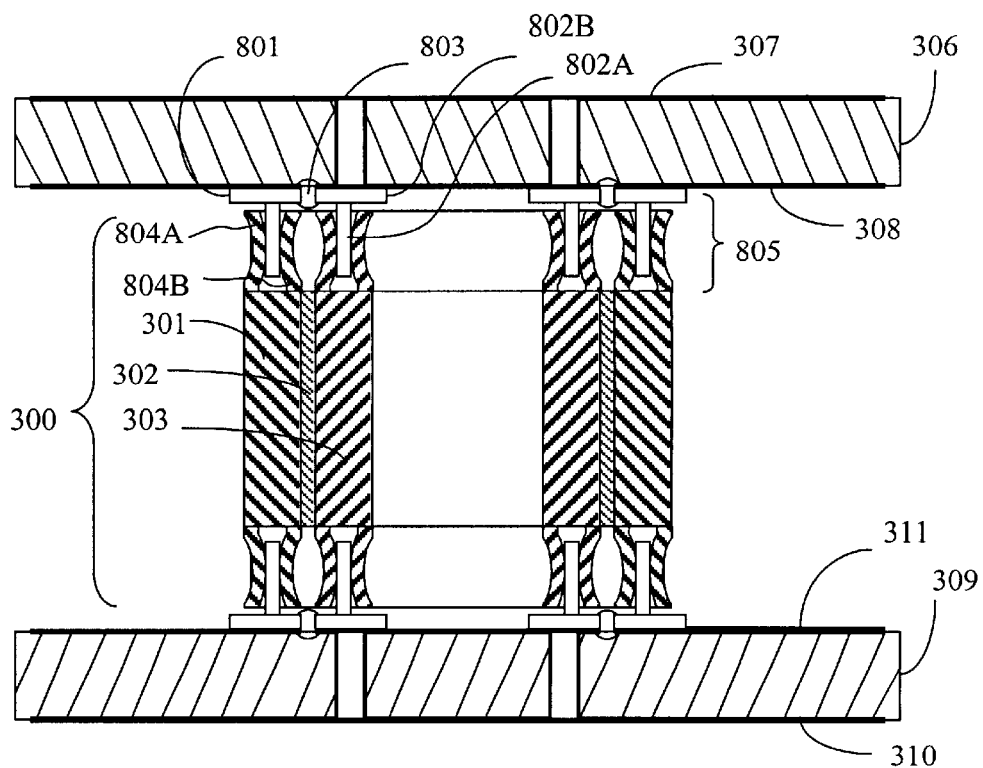
FIG. 8A is a two-dimensional section view of a power standoff assembly structure in which coaxial ring structures are joined to both the upper and lower planar circuit to form coaxial blades which engages into spring furrows which are an integral part of the inner and outer cylinders of the power standoff assembly.

FIG. 8A is an illustration of a further embodiment of the present invention in which the ends of the power feed standoff assembly 300 include a receptive spring assembly 805.

The receptive spring feature 805 includes a blade portion 801 and a spring portion 804 for slidably engaging the blade portion 801, thus making electrical contact between the blade portion 801 and the spring portion 804. In the illustrated embodiment, the spring portion 804 includes opposing spring portions 804A, 804B, which grasp the mating blade portion 801 (which, when viewed from below, have the appearance of concentric blades) therebetween. The male portion 801A of the blades 801 are mounted to the respective circuit boards by an attachment portion 801B which has a surface suitable for mounting on the conductive surfaces of the respective circuit boards (e.g. the first conductive member 303 electrically coupled to a first conductive surface 307 and the second conductive member 301 electrically coupled to the second conductive surface 308).

Figures 8B, 8C:
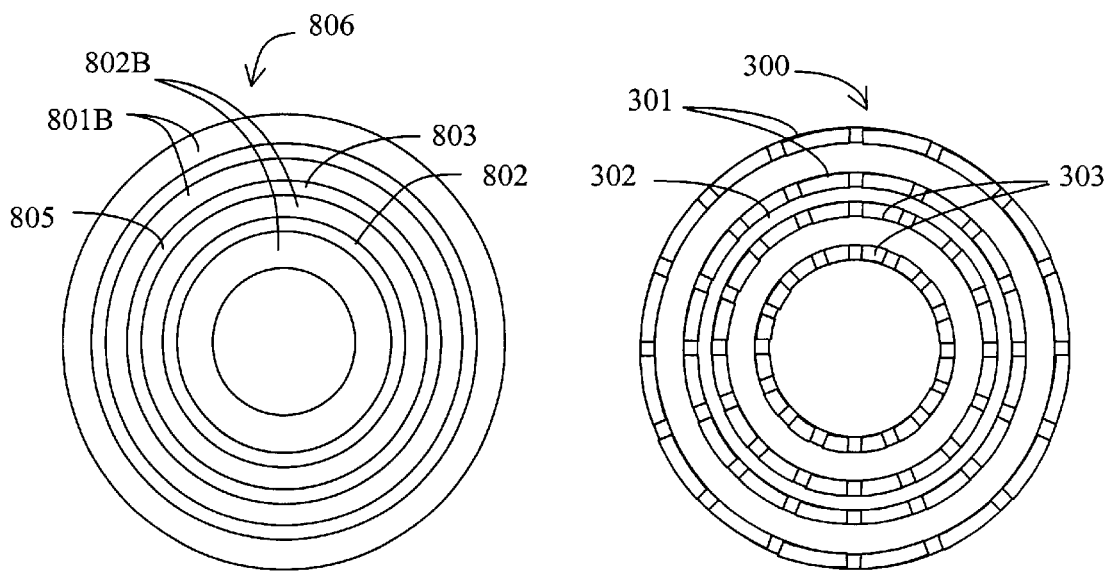
FIG. 8B is a two-dimensional plan view of the coaxial ring structure of FIG. 8A.
FIG. 8C is a two-dimensional plan view looking into the spring furrows of the inner and outer cylinders of FIG. 8A.

FIG. 8B is a plan view of the power feed standoff assembly 300 illustrated in FIG. 8A looking into the concentric blade assemblies 801 and 802. In order to ease the assembly of blade assemblies 801 and 802 to first and/or the second circuit boards 306, 309, blade assemblies 801 and 802 can be joined together with an insulative plastic resin 803, thus forming the integraded blade assembly 806. Although not shown, this assembly may have vertical protrusion features that are a part of 801, 802 or 803 which engage into mating holes in PCBs 306 and 309 to facilitate alignment and assembly.

In order to improve the flexibility of female portion 804 of the receptive spring assembly, the female portion 804 can be segmented in a plurality of segments arranged in concentric rings.

FIG. 8C is a plan view looking into the top or bottom of the first and second conductive members 303 and 301 illustrating how the female portion 804 can be segmented.

In usage, power feed standoff assembly 300 is simply plugged into assembly 806 without the need for a fastener. It will be recognized that power feed standoff assembly 300 need only have spring arrangement 804 and blade assembly 801, 802 on one side, and that the other side of the assembly 300 can be permanently secured to either PCB 306 or 309 using methods previously described in this invention disclosure. Further although in the illustrated embodiment, the receptive spring assembly 804 is included on both the first conductive member 303 and the second conductive member 301, this assembly can be utilized on only one of the conductive members, or a single-sided spring (e.g. excluding 804B) can also be used if desired. Further, the receptive spring assembly 805 can be an integral part of the first and or second conductive members 303, 301, or can be separately fashioned, and affixed to the ends of the first and second conductive members 303, 301.

In order to improve the benefit of the power feed standoff assembly 300, it is beneficial to efficiently couple the electrical energy from the conductive surfaces of the first and second circuit boards 306, 309 to the first and second conductive members 303, 301.

The preceding discussion described the circuit board conductive surfaces (pad) features as simply a power pad which connect to either the first or second conductive members 303, 301. In many cases, the power and ground planes of the first and second circuit boards 306, 309 are not disposed on an outer surface of the circuit board, but rather, are disposed in inner layers, separated by one or more insulative layers. Such low impedance power planes within the PCBs 306, 309 can be coupled to the first conductive member 303 and the second conductive member 301 as described below.

FIG. 9A is a drawing presenting a section view of an exemplary circuit board 900 (or PCB) that could be in place of the first circuit board 306 and or the second circuit board 309.

Generally, PCB 900 will have at least one pair of conductive planes dedicated to power distribution. FIG. 9A, for example, illustrates a first conductive plane 902 and a second conductive plane 903. Conductive plane 902 can be considered the voltage power plane and plane 903 can be considered the ground power plane, which together represent a power plane pair. These planes are usually separated from each other by a thin dielectric or insulative layer 950 to keep the electrical impedance of the power plane pair low.

To electrically connect the conductive planes to the first and second conductive members 303, 301 of the power feed standoff assembly 300, it is desirable to bring the electrical energy from the power plane 902 and the ground plane 903 to external surface features of the PCB 900. This can be accomplished by a first plurality of plated through holes 906 to provide an electrical path from the power plane 902 to one or more conductive surfaces 910, 911 on the external surface of the circuit board 900, and a second plurality of plated through holes 905 to provide an electrical path from the ground plane 903 to one or more other conductive surfaces 912, 956 of the circuit board 900. The PTHs 906 and 905 are arranged so as to coincide with the location of the first conductive member 303 and the second conductive member 301, respectively, when the power feed standoff assembly is disposed adjacent to the circuit board 900. When the circuit board 900 includes an aperture for a screw or other fastener, the PTHs 906 can be arranged in concentric circles (an inner concentric circle and an outer concentric circle) around the aperture as shown.

In FIG. 9A concentric PTHs 906 connect to voltage power plane 902 and surface plane pads 910 and 911 shown in FIGS. 9B and 9E. Additionally, main screw hole 907 electrically connects to voltage power plane 902 and conductive surface plane pads 910 and 911.

Collectively, the preceding creates one half of the low impedance connection from the power plane 902 to the surface pad 910. As described in the previous embodiments, the further connection to the power plane of the second circuit board can be accomplished as described in any of the foregoing embodiments. For example, through the first conductive member 303, the fastener 305, and the washer 304, and hence, to a power plane in the second circuit board as shown in FIG. 3.

Similarly, concentric ring of PTHs 905 connect to ground power plane 903 and to surface plane pads 912 and 956. Thus, when second conducive member 301 shown in FIG. 3 connects to surface pad 912, the second half of the low impedance connection from the power ground plane 903 to the second conductive member 301 is created.

FIGS. 9C and 9D illustrate the conductive patterns for power planes 902 and 903 respectively. It will be understood that although they are shown as terminating, exterior conductive feature 951 in FIG. 9C and feature 953 in FIG. 9D extend out and represents a continuum of each of the power planes in PCB 309.

Note that the arrangement of external conductive surfaces 307, 308, 310, and 311 depicted in FIG. 3 is essentially duplicated in the embodiment shown in FIG. 9A. That is, with respect to the second circuit board 309, surfaces 910 and 911 are analogous to surfaces 307, and surface 912 is analogous to surface 311. And, with respect to the first circuit board 306, surfaces 910 and 911 are analogous to surface 307 and surface 956 is analogous to surface 308.

The foregoing describes exemplary embodiments of how internal power planes may be efficiently coupled to a screw terminal of FIG. 3. The techniques presented herein can be extended to a general case which a concentric ring of PTHs from the power planes join to surface features of the target PCB in order to efficiently couple the electrical energy of the planes into the concentric coaxial cylinders of the power standoff assembly.

Figure 10:
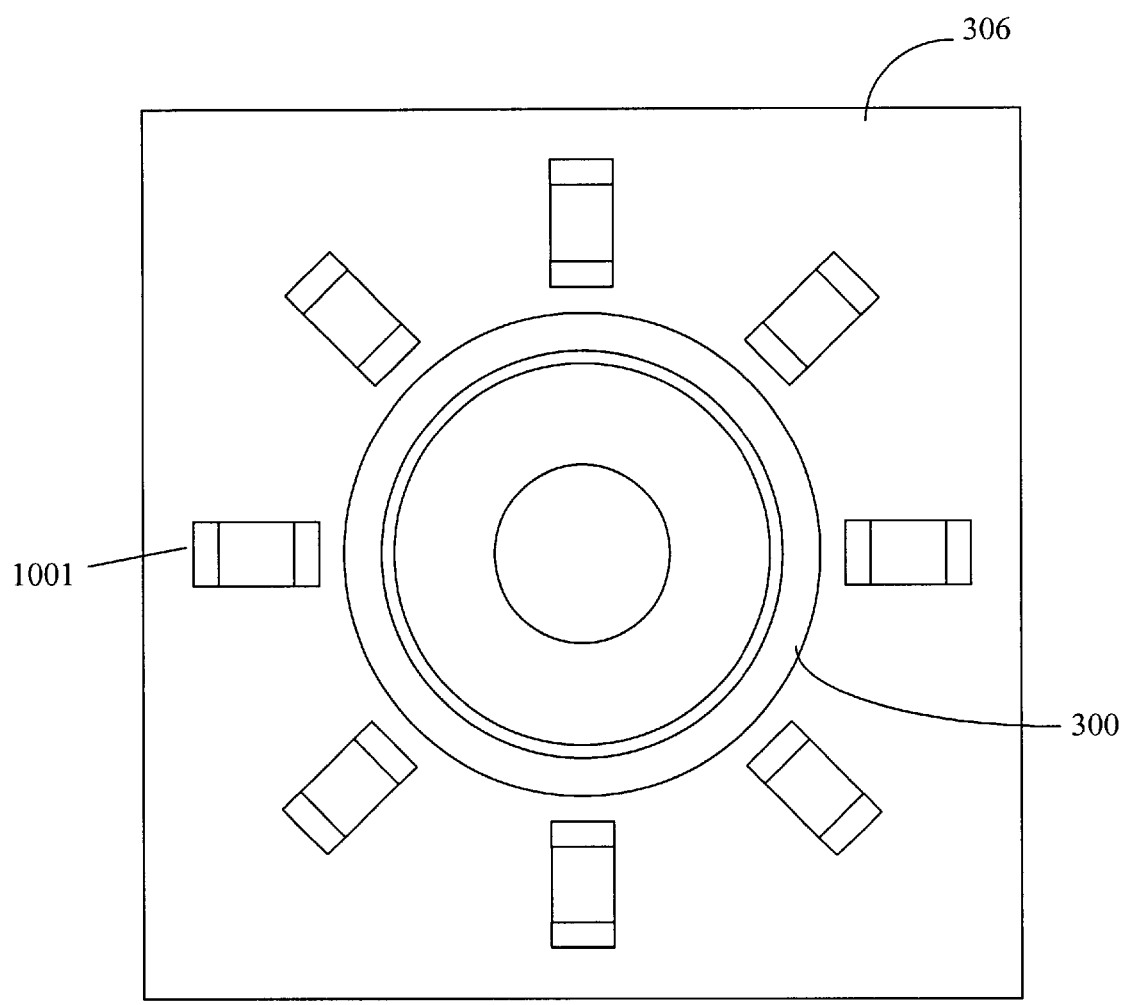
FIG. 10 is a 2-dimensional plan view of a power standoff assembly structure which is surrounded with capacitors in order to improve the overall connection impedance.

FIG. 10 illustrates an arrangement where the power standoff assembly 300 is mounted on PCB 306 and is surrounded with surface mount bypass capacitors 1001. In practice when a power plane structure consisting of a voltage and ground plane, for example, is connected to a power standoff assembly 300 the concentration of the electromagnetic fields as they approach the power standoff assembly 300 tend to create an increasing impedance at the power standoff assembly 300 connection due to the fact that the current paths are utilizing an ever decreasing portion of the planar structure in which the power is passing. This effect can be reduced by adding bypass capacitors 1001 which are connected to power planes within PCB 306 in a concentric pattern as shown in FIG. 10 so as to reduce the impedance of the planes at a point very near to the power standoff assembly 300 connections to the plane. This arrangement is superior to placing bypass capacitors 1001 at a remote point from the power standoff assembly 300 where the impedance of the planes at the power standoff assembly 300 connection are not corrected.

Figure 11A:
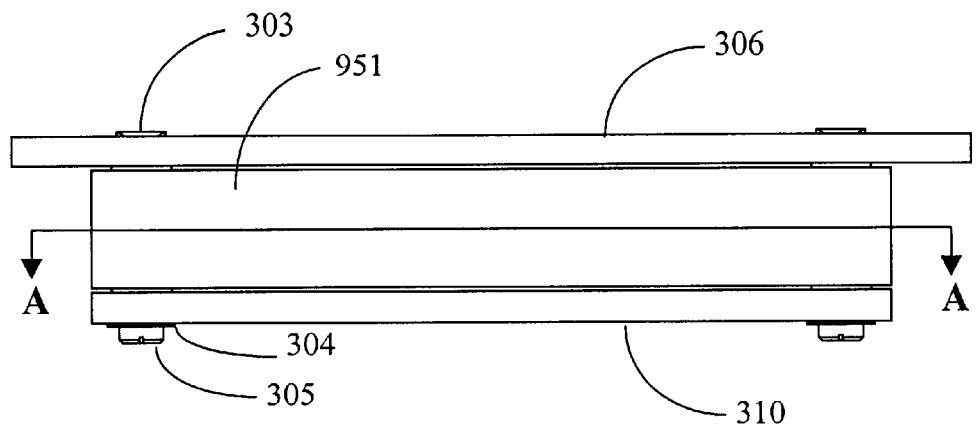
FIG. 11A is a 2-dimensional side view of an EMI frame using power standoff assemblies integral with the frame assembly.
Figure 11B:
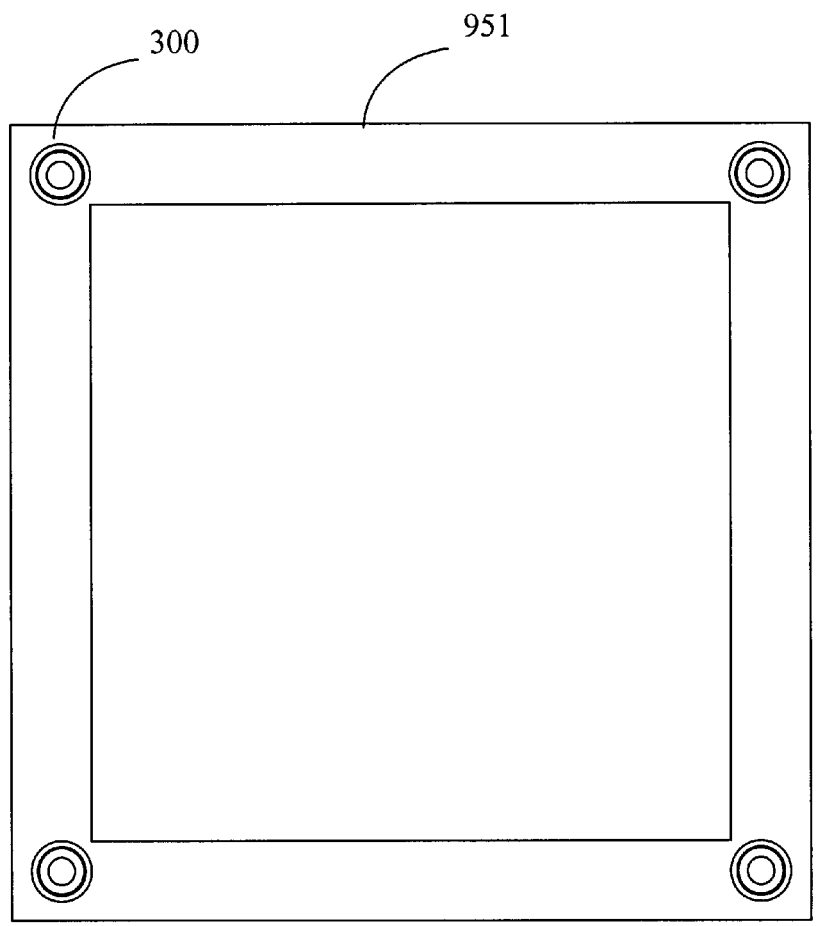
FIG. 11B is a 2-dimensional plan section view of the EMI frame shown in FIG. 10A.

FIGS. 11A and 11B illustrate such an electromagnetic interference (EMI) frame 1101 incorporating power coupling devices therein. The EMI frame 1101 is used to contain undesirable electromagnetic fields from radiating to an external environment. Here the power standoff assembly 300 can either be a separate assembly that is passed into the frame 1101 or the frame 1101 may become a part of the power standoff assembly's second conductor 301 with the first conductor cylinder 303 and the dielectric 302 similar to what has been described in the referenced related patent disclosures. In one embodiment, the second conductor 301 protrudes slightly higher than the base of the frame 1101 so as to insure that electrical contact is made at the outer cylinder 301 and not at some general feature of the frame. In this way the integrity of the coaxial current paths are maintained. Note also that in the interest of clarity, FIG. 11A does not show EMI gasketing materials between the frame and PCB 306 and PCB 309.

Figure 12:
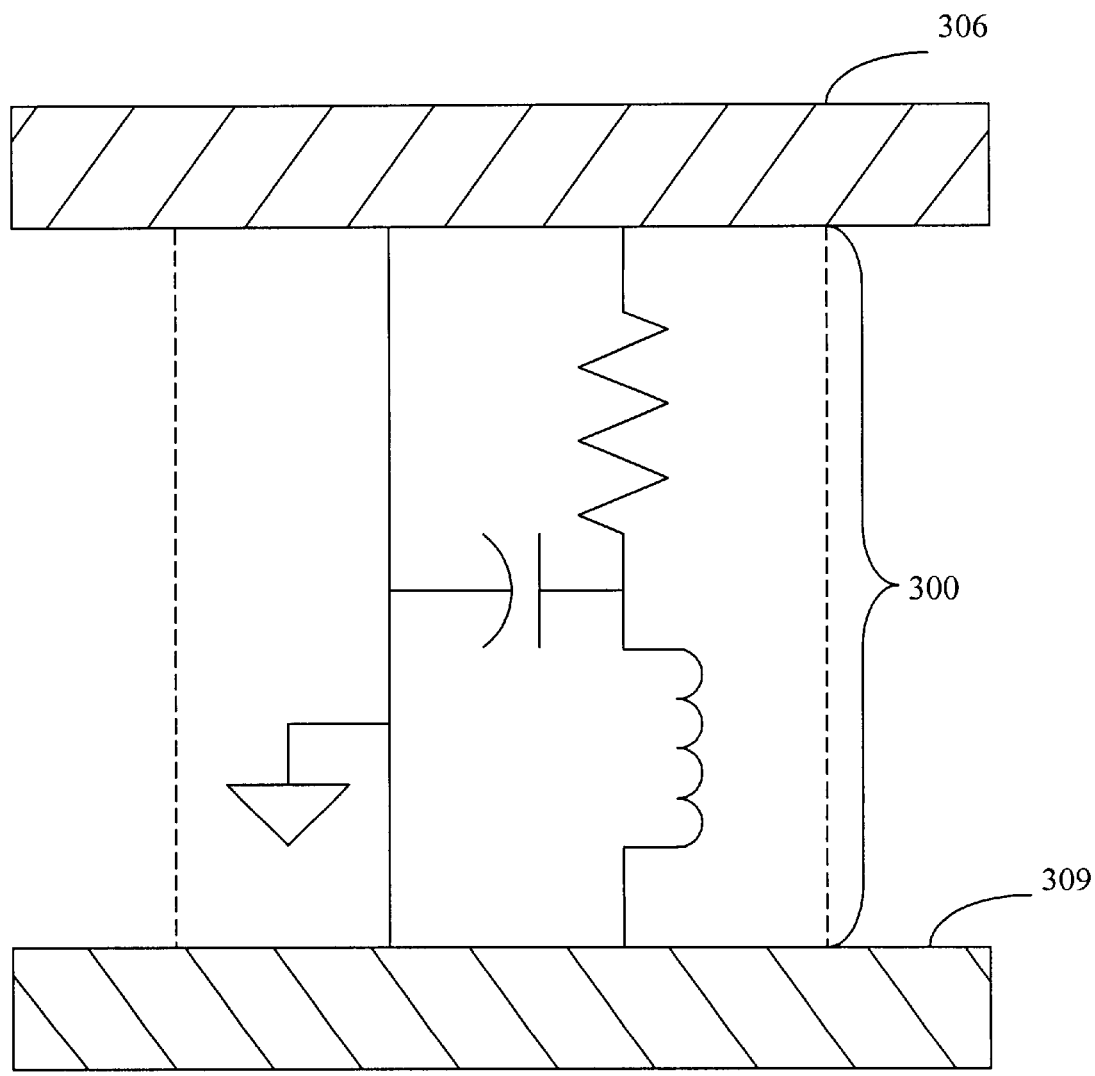
FIG. 12 is a diagram illustrating how the power standoff assembly can be used as a circuit element between the circuit boards.

FIG. 12 illustrates how the power standoff assembly 300 may be used as a circuit element between PCB 306 and PCB 309. The power standoff assembly 300 can be represented electrically as a series RLC circuit as shown. One or more of the circuit elements may be used to enhance the electrical performance of the signals transferred between the two PCBs 306 and 309 by using the power standoff assembly 300 as a filter or as a storage element in the circuit path. The power standoff assembly 300 may be an additional component that is added to either PCB 306 or PCB 309 or it may replace a component on either PCB or both. The benefits may be less complexity overall on either or both PCB's.

Additionally, the capacitive portion of the power standoff assembly 300 may be enhanced by decreasing the dielectric 302 spacing between the inner and outer electrodes and or by choosing a material whose dielectric constant increases the overall capacitance. Thus, the power standoff assembly may also act as an inductive or capacitive storage element.

Conclusion

This concludes the description of the preferred embodiments of the present invention. In summary, the present invention describes a method, apparatus, and article of manufacture for providing power from a first circuit board having a first circuit board first conductive surface and a first circuit board second conductive surface to a second circuit board having a second circuit board first conductive surface and a second circuit board second conductive surface. The apparatus comprises a first conductive member, including a first end having a first conductive member surface electrically coupleable to the first circuit board first conductive surface and a second end distal from the first end having a first conductive member second surface electrically coupleable to the second circuit board first surface. The apparatus also comprises a second conductive member, having a second conductive member first surface electrically coupleable to the first circuit board second surface and a second conductive member second surface distal from the second conductive member first surface electrically coupleable to the second circuit board second conductive surface.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A printed circuit board assembly comprising:
    a first circuit board having a first circuit board first conductive surface and a first circuit board second conductive surface;
    a second circuit board having a second circuit board first conductive surface and a second circuit board second conductive surface;
    a hollow first conductive member, including a first end having a first conductive member first surface in contact with and electrically coupled to the first circuit board first conductive surface, a second end distal from the first end having a first conductive member second surface in contact with and electrically coupled to the second circuit board first surface and a compressible section urging said contact; and
    a second conductive member, disposed within the first conductive member and mechanically coupling the first circuit board and the second circuit board such that the two circuit boards are separated by a rigid portion of the second conductive member, the second conductive member having a second conductive member first surface electrically coupled to the first circuit board second surface and a second conductive member second surface distal from the second conductive member first surface electrically coupled to the second circuit board second conductive surface.

2. The apparatus of claim 1, wherein the first conductive member is a different length than the second conductive member.

3. The apparatus of claim 2, wherein the first conductive member and the second conductive member have matching cross sectional shapes selected from group comprising:
   circular;
   ovoid; and
   rectangular.

4. The apparatus of claim 2, wherein the first conductive member and the second conductive member are coaxial.

5. The apparatus of claim 4, further comprising a dielectric disposed between the first conductive member and the second conductive member.

6. The apparatus of claim 1, wherein:
   the second conductive member is rigid mechanical standoff member mechanically coupling the first circuit board and the second circuit board, and is disposable between the first circuit board first conductive surface and the second circuit board first conductive surface such that the first circuit board and the second circuit board are separated by a standoff distance.

7. The apparatus of claim 1, wherein the compressible section is a crushable washer.

8. The apparatus of claim 1, wherein the compressible section is a spring portion.

9. The apparatus of claim 8, wherein the spring portion is disposed at the first end and compressibly contacts the first circuit board first conductive surface.

10. The apparatus of claim 8, wherein the spring portion is disposed at the second end and compressibly contacts the second circuit board first conductive surface.

11. A printed circuit board assembly comprising:
   a first circuit board having a first circuit board first conductive surface and a first circuit board second conductive surface;
   a second circuit board having a second circuit board first conductive surface and a second circuit board second conductive surface;
   a hollow first conductive member, including a first end in contact with and electrically coupled to the first circuit board first conductive surface, a second end distal from the first end in contact with and electrically coupled to the second circuit board first surface and a compressible section urging said contact; and
   a second conductive member, disposed within the first conductive member and mechanically coupling the first circuit board and the second circuit board such that the two circuit boards are separated by a standoff distance, the second conductive member having a second conductive member first surface electrically coupled to the first circuit board second surface and a second conductive member second surface distal from the second conductive member first surface electrically coupled to the second circuit board second conductive surface.

12. A printed circuit board assembly comprising:
   a first circuit board having a first circuit board first conductive surface and a first circuit board second conductive surface;
   a second circuit board having a second circuit board first conductive surface and a second circuit board second conductive surface;
   a first conductive member, including a first end in contact with and electrically coupled to the first circuit board first conductive surface, a second end distal from the first end in contact with and electrically coupled to the second circuit board first surface and a compressible section urging said contact; and
   a hollow second conductive member, with the first conductive member disposed within and mechanically coupling the first circuit board and the second circuit board such that the two circuit boards are separated by a standoff distance, the second conductive member having a second conductive member first surface electrically coupled to the first circuit board second surface and a second conductive member second surface distal from the second conductive member first surface electrically coupled to the second circuit board second conductive surface.

13. A power feed standoff assembly for mechanically coupling a first circuit board with a through hole to a second circuit board with a through hole and for providing a ground path and a power path between the two circuit boards, the power feed standoff assembly comprising:
   a hollow first conductive member, including a first end having an electrical contact surface, a second end distal from the first end and having an electrical contact surface and a compressible section providing force in a longitudinal direction of the first conductive member when compressed: and
   a second conductive member disposed coaxially within the first conductive member and having
   a mechanical connector portion configured to extend into a through hole in a circuit board,
   a rigid standoff section extending in the longitudinal direction from the mechanical connector portion and having a shelf portion which exceeds a diameter of the through hole and a contact surface distal from the shelf portion with the contact surface not extending beyond the electrical contact surface of the second end of the first conductive member.

14. A power feed standoff assembly for mechanically coupling a first circuit board with a through hole to a second circuit board with a through hole and for providing a ground path and a power path between the two circuit boards, the power feed standoff assembly comprising:
   a first conductive member, including a first end having an electrical contact surface, a second end distal from the first end and having an electrical contact surface and a compressible section providing force in a longitudinal direction of the first conductive member when compressed: and
   a hollow second conductive member, with the first conductive member disposed coaxially within the second conductive member, the second conductive member having
   a mechanical connector portion configured to extend through a through hole in a circuit board,
   a rigid standoff section extending in the longitudinal direction from the mechanical connector portion and having a shelf portion which exceeds a diameter of the through hole and a contact surface distal from the shelf portion with the contact surface not extending beyond the electrical contact surface of the second end of the first conductive member.

* * * * *